(12) United States Patent
Hawrylchak et al.

(10) Patent No.: US 10,535,513 B2
(45) Date of Patent: Jan. 14, 2020

(54) APPARATUS AND METHODS FOR BACKSIDE PASSIVATION

(71) Applicant: Applied Materials, Inc., Santa Clara, CA (US)

(72) Inventors: Lara Hawrylchak, Gilroy, CA (US); Jeffrey Tobin, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/008,500

(22) Filed: Jun. 14, 2018

(65) Prior Publication Data

US 2018/0294153 A1 Oct. 11, 2018

Related U.S. Application Data

(62) Division of application No. 14/087,815, filed on Nov. 22, 2013, now Pat. No. 10,020,187.

(60) Provisional application No. 61/730,051, filed on Nov. 26, 2012.

(51) Int. Cl.
*H01L 21/02* (2006.01)
*H01L 21/67* (2006.01)

(52) U.S. Cl.
CPC .. *H01L 21/02252* (2013.01); *H01L 21/02238* (2013.01); *H01L 21/02247* (2013.01); *H01L 21/6719* (2013.01)

(58) Field of Classification Search
CPC ........... H01L 21/02252; H01L 21/6719; H01L 21/02238; H01L 21/02247

USPC .............. 427/569–579; 118/723 R, 723 MW, 118/723 ME, 723 MR, 723 MA, 723 E, 118/723 ER, 723 I, 723 IR

See application file for complete search history.

(56) References Cited

U.S. PATENT DOCUMENTS

| | | | |
|---|---|---|---|
| 4,962,049 A | 10/1990 | Chang et al. | |
| 5,248,635 A | 9/1993 | Bouayad-Amine et al. | |
| 5,879,128 A * | 3/1999 | Tietz | H01L 21/68742 414/757 |
| 5,937,304 A | 8/1999 | Yoshinouchi | |
| 6,316,361 B1 | 11/2001 | Hansson | |
| 6,485,531 B1 * | 11/2002 | Schob | H01L 21/6715 29/25.01 |

(Continued)

FOREIGN PATENT DOCUMENTS

| | | |
|---|---|---|
| CN | 1902031 A | 1/2007 |
| EP | 0822274 A2 | 2/1998 |

(Continued)

OTHER PUBLICATIONS

PCT International Preliminary Report on Patentability in PCT/US2013/071673, 9 pages, dated Jun. 4, 2015.

(Continued)

*Primary Examiner* — Michael P Wieczorek
*Assistant Examiner* — Michael G Miller
(74) *Attorney, Agent, or Firm* — Servilla Whitney LLC (57) ABSTRACT

Provided apparatus and methods for back side passivation of a substrate. The systems comprise an elongate support with an open top surface forming a support ring so that when a substrate is on the support ring, a cavity is formed within the elongate support. A plasma generator is coupled to the cavity to generate a plasma within the cavity to deposit a passivation film on the back side of the substrate.

19 Claims, 3 Drawing Sheets

(56) References Cited

U.S. PATENT DOCUMENTS

| | | | |
|---|---|---|---|
| 6,851,384 B2* | 2/2005 | Yuda | C23C 16/402 |
| | | | 118/723 ER |
| 8,324,511 B1 | 12/2012 | Huemoeller et al. | |
| 8,372,733 B2 | 2/2013 | Signamarcheix et al. | |
| 8,440,554 B1 | 5/2013 | Hiner et al. | |
| 2002/0028567 A1* | 3/2002 | Aruga | C23C 16/401 |
| | | | 438/488 |
| 2002/0076507 A1* | 6/2002 | Chiang | C23C 16/0227 |
| | | | 427/569 |
| 2007/0269297 A1 | 11/2007 | Meulen et al. | |
| 2009/0258485 A1* | 10/2009 | Liu | C23C 18/1605 |
| | | | 438/612 |
| 2014/0041689 A1* | 2/2014 | Namba | H01L 21/02019 |
| | | | 134/22.1 |

FOREIGN PATENT DOCUMENTS

| | | |
|---|---|---|
| EP | 1143495 A1 | 10/2001 |
| JP | H01189910 A | 7/1989 |
| JP | H03116833 A | 5/1991 |
| JP | H04137613 A | 5/1992 |
| JP | H05-275342 A | 10/1993 |
| JP | H10-050616 A | 2/1998 |
| JP | 200150399 A | 5/2000 |
| JP | 2001102321 A | 4/2001 |
| JP | 2002208590 A | 7/2002 |
| JP | 2007511104 A | 4/2007 |
| JP | 2007242869 A | 9/2007 |
| JP | 2007526637 A | 9/2007 |
| JP | 2008153510 A | 7/2008 |
| KR | 1020080095413 A | 10/2008 |
| KR | 1020110039133 A | 4/2011 |
| WO | 2005048313 A2 | 5/2005 |
| WO | 2005093353 A1 | 10/2005 |
| WO | 2010/140889 A1 | 12/2010 |
| WO | 2012087613 A2 | 6/2012 |

OTHER PUBLICATIONS

PCT International Search Report and Written Opinion in PCT/US2013/071673, dated Mar. 14, 2014, 12 pages.

* cited by examiner

APPARATUS AND METHODS FOR BACKSIDE PASSIVATION

CROSS-REFERENCE TO RELATED APPLICATIONS

This application is a divisional of U.S. patent application Ser. No. 14/087,815, filed Nov. 22, 2013, which claims priority to U.S. Provisional Application No. 61/730,051, filed Nov. 26, 2012, the entire contents of which are hereby incorporated by reference herein.

FIELD

Embodiments of the invention generally relate to an apparatus and a method for passivation of the back side of a substrate. More specifically, embodiments of the invention relate to apparatus including an elongate support which when a substrate is present has a cavity that a plasma can be generated in to form a passivation layer on the backside of the substrate.

BACKGROUND

Wafers (also referred to as substrates) in high temperature chambers can have backside layers that are susceptible to outgassing or sublimation. The sublimates or volatilized film components or contaminants can attack chamber hardware in a variety of manners. Outgassing dopants or silicon sublimates can coat chamber components including the reflector plates (optical reflectors?) or the pyrometers, which causes chamber drift over time and necessitates recalibration, hardware changes, or chamber cleans that result in down time. Fluorine from the backside of wafers can attack the coating on the reflector plate (reflectors), and also necessitates recalibration and eventual hardware replacement.

Rapid Thermal Processing (RTP) and other processes and hardware can suffer if the film or even the bare silicon of the back of the wafer outgasses (in the case of films) or sublimates (in the case of silicon) during the processing of the wafer. The outgassed and sublimated material can coat optics or other chamber components causing the need for replacement and/or cleaning on a too frequent basis.

Currently, methods of dealing with this are problem-specific (e.g., different reflector plate stacks for fluorine resistance, MWBC kits providing sacrificial parts for silicon sublimation or dopant outgassing).

Therefore, there is an ongoing need in the art for apparatus and methods of preventing outgassing and sublimation from wafers during processing.

SUMMARY

Embodiments of the invention are directed to processing methods comprising placing a substrate having a front side to be processed and a back side into a chamber. The backside of the substrate is passivated in the chamber and the front side of the substrate is processed, wherein processing the front side comprises heating the substrate.

In some embodiments, passivating the back side of the substrate comprises depositing a passivating film on the back side of the substrate by exposing the back side of the substrate to one or more of a reactive gas or a plasma.

In one or more embodiments, the film comprises one or more of a nitride and an oxide layer. In some embodiments, the film has a thickness greater than about 15 Å.

In some embodiments, the chamber is a load-lock chamber and the substrate is moved to a second chamber after passivating the back side and before processing the front side.

In one or more embodiments, passivating the back side of the substrate and processing the front side of the substrate occurs in a single chamber.

In some embodiments, the chamber is an intermediate region between a load lock chamber and a processing chamber that processes the front side of the substrate.

One or more embodiments further comprise removing the passivating film from the back side of the substrate.

Additional embodiments of the invention are directed to backside passivation systems. The systems comprise an elongate substrate support to hold a substrate. The elongate substrate support has a cylindrical body including an open top surface with a support ring to hold the substrate by an edge region of the substrate so that when a substrate is on the support ring, the cylindrical body and the substrate define a cavity. The system includes a plasma source to form a passivation film on the back side of the substrate.

Some embodiments further comprise lift pins to move a substrate closer to and further from the support ring.

In one or more embodiments, the system is positioned within a load-lock chamber so that a substrate passing through the load lock chamber can be positioned on the elongate substrate support and a back side of the substrate can be exposed to the plasma to form the passivation film.

In some embodiments, the system is positioned within a semiconductor processing chamber so that a substrate can be positioned on the elongate substrate support and a back side of the substrate can be exposed to a plasma to form the passivation film and the front side of the substrate can be processed without moving the substrate.

In one or more embodiments, the system is positioned within a tunnel connecting a transfer station to a processing chamber so that a substrate being moved from the transfer station to the processing chamber can be positioned on the elongate substrate support and a back side of the substrate can be exposed to the plasma to form the passivation film and then the substrate can be moved further along the tunnel to the processing chamber for further processing.

In some embodiments, wherein the plasma generator is at least about 1 inch from the back side of the substrate.

In one or more embodiments, the plasma generator creates an inductively coupled RF plasma in cavity.

In some embodiments, the plasma generator is located remotely from the cavity and the plasma (or downstream effluent of the plasma) is flowed into the cavity.

Further embodiments of the invention are directed to backside passivation systems comprising a load lock with an antechamber to receive at least one substrate in a holding position. The system includes an elongate support having a cylindrical body with an open top surface forming a support ring. The elongate substrate support is positioned beneath the holding position so that when a substrate is in the holding position, the cylindrical body and the substrate define a cavity. A plasma generator coupled to the cavity to generate a plasma in the cavity to form a passivation film on the back side of the substrate.

In some embodiments, when a substrate is in the holding position, the plasma generator generates a plasma at least about 1 inch from a back side of the substrate.

One or more embodiments further comprise a lift to move the at least one substrate closer to and further from the elongate support.

In some embodiments, the plasma generator creates an inductively coupled RF plasma in the cavity.

BRIEF DESCRIPTION OF THE DRAWINGS

So that the manner in which the above recited features of the invention are attained and can be understood in detail, a more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the invention are directed to backside passivation chambers that can be added to a cluster tool with other chambers (e.g., RTP chambers). The backside passivation chamber may be a plasma-based addition of a passivation layer as a backside cap. The initial target would be to provide a thin nitride layer on the backside of the wafer without altering the front side of the wafer. This has been shown to be effective in mitigating sublimation of silicon and some dopants. The chamber can also be modified to allow for other types of simple films (e.g., oxides) and possibly light surface cleans.

In a first aspect, a heated lamp upper chamber component uses a radical source (remote plasma source) mounted on the bottom chamber portion to provide the excited species for layer formation. In order to get the required thickness, the lamps are required to heat the wafer and allow for adequate diffusion depth.

In a second aspect, a direct plasma ICP-type source mounted in the lower chamber portion below the wafer. The front side of the wafer faces the upper chamber portion, which is shielded from the plasma via mechanical restrictions. The direct plasma solution does not require elevated temperature to produce a film thickness sufficient to suppress outgassing or sublimation, and would not be otherwise heated.

When the passivation chamber is a simple chamber, it may take up a port on a cluster tool. However, on some systems, a port may be unavailable. Therefore, it would be beneficial to find a location that passivates the backside of the wafer but does not take up a port. In a third aspect, a simple inductive plasma generation source is put under the wafer in a single or multiple wafer loadlock (although it would act on the wafer in the loadlock directly above the plasma source). The wafer is pumped down from atmosphere as in any loadlock, but when the pressure is suitably low (~<200 mTorr), the plasma can be struck in a nitrogen ambient which will produce a SiN or SiON coating on the back of the wafer. The wafer is placed on top of a structure that effectively seals the plasma from the front side so that only the backside is affected/passivated. The rest of the functioning of the loadlock is maintained.

Figure 1:
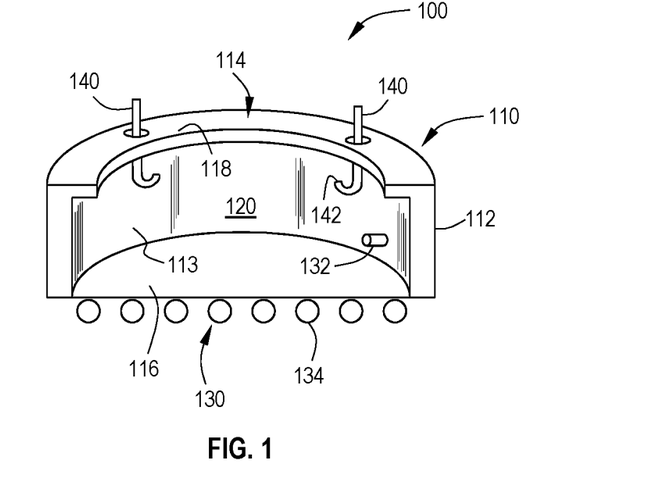
FIG. 1 shows a portion of a backside passivation system in accordance with one or more embodiments of the invention.

Accordingly, one or more embodiments of the invention are directed to back-side passivation systems. FIG. 1 shows an example of a portion of a backside passivation system 100. The system 100 includes a substrate support 110 to hold a substrate. As used in this specification and the appended claims, the terms "substrate" and "wafer" are used interchangeably. The substrate support 110 comprises an elongate cylindrical body 112 with a top surface 114 and a bottom 116. The elongate cylindrical body 112 may be described as "bucket" shaped.

Figure 2:
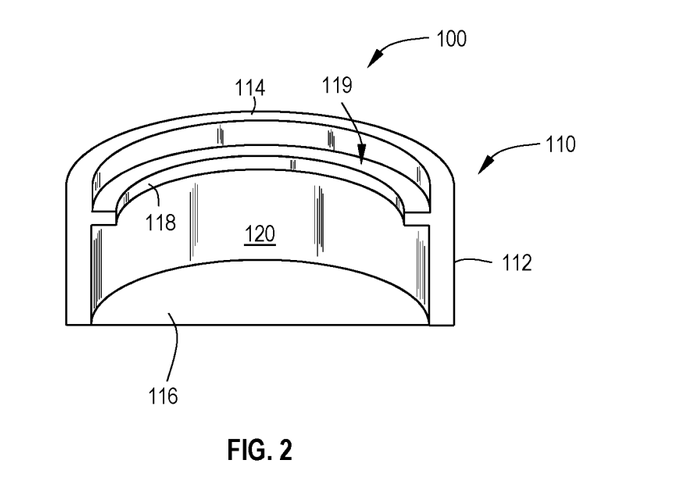
FIG. 2 show a portion of a backside passivation system in accordance with one or more embodiments of the invention.

The top surface 114 has a support ring 118 which can support a substrate by the edges of the substrate. The support ring 118 can be a flat surface, like that in FIG. 1, or can have a recess 119 that the substrate would sit in (see FIG. 2). The support ring 118, whether flat or recessed, holds the substrate by the edge so that the area of the substrate resting on the support ring is minimized. The portion of the substrate that is resting on the ring will not be subject to, or will have a diminished, backside passivation. The substrate support holds the substrate around the edge and covers in the range of about 0.5 to about 3 mm of the edge, or in the range of about 1 mm to about 2.5 mm of the edge, or in the range of about 1.5 mm to about 2 mm of the edge. In one or more embodiments, the substrate support covers about 2 mm of the edge of the substrate When the substrate is on the support ring 118, a cavity 120 is formed within the substrate support. The cavity 120 is defined by the inside wall 113 of the elongate cylindrical body 112, the bottom 116 and the back side of the substrate (not shown). The contact of the substrate on the support ring prevents the reactive gas or plasma from flowing to the front side of the substrate. The seal between the substrate and the substrate support may be a plasma seal. Some gas could leak through to the front side of the wafer so long as the plasma is extinguished.

The support ring 110 can be made of any suitable material including, but not limited to, aluminum. The support ring 110 of some embodiments is electrically grounded.

A plasma source 130 is coupled to the cavity 120 of the substrate support 110. The plasma source 130 forms a passivation film on the back side of the substrate and includes a gas inlet 132 and a device to create a reactive species in the cavity. The gas inlet 132 is in fluid communication with a gas source which is suitable for creating a passivation layer on the back side of the substrate. The gas source can be, for example, nitrogen, oxygen or a mixture thereof. When the gas is nitrogen, the passivation layer will include a nitride layer and when the gas is oxygen, the passivation layer will include an oxide layer. In some embodiments, passivation film is one or more of a nitride, an oxide and an oxynitride. In one or more embodiments, the substrate is silicon and the passivation layer comprises silicon nitride. The nitridation process may be self-limiting so that a maximum layer thickness if generated. Oxide layers, on the other hand, may continue to grow which results in a passivation film that is harder to remove, but still functions.

The device to create the reactive species, the plasma source 130, can be any suitable device capable of generating a reactive gas and/or a plasma. For example, the plasma source 130 can generate radicals and/or ions of a gas to form the passivation layer on the backside of the substrate. Suitable plasma sources include, but are not limited to, thermal elements capable of creating radicals (e.g., hot wires) and inductively coupled plasma coils 134 (as shown in FIG. 1) to generate ions. In some embodiments, the plasma is generated within the cavity, for example by ICP coils. In one or more embodiments, the plasma (or its downstream effluent) is generated remotely and flowed into the cavity, for example, in a remote plasma system. As used in this specification and the appended claims, use of the term plasma includes the downstream effluent.

Suitable substrates include, but are not limited to silicon, germanium and HF lasted wafers. The backside of the substrate can be featureless or can have features already formed thereon. When there are features already formed on the backside of the wafer, embodiments of the invention protect the features and the processing equipment in a no-harmful way to avoid sublimation of the films that form the features.

The distance from the backside of the substrate to the plasma source 130 can affect the passivation film formed on the backside. For example, if the plasma source 130 is too close to the backside of the wafer, direct coupling between the substrate and the source can result in damage to the wafer. If the distance is too large, there may be insufficient reactive species to form the passivation layer. In some embodiments, the distance between the plasma source 130 and the backside of the wafer is in the range of about 0.25 inch to about 2.5 inch, or in the range of about 0.5 inch to about 2 inch, or in the range of about 0.75 inch to about 1.75 inch, or in the range of about 1 inch to about 1.5 inch. In one or more embodiments, the distance between the backside of the wafer and the plasma source 130 is at least about 1 inch, or at least about 1.5 inch. In some embodiments, the distance between the backside of the wafer and the plasma source 130 is about 2 inches.

The wafer is held on the support ring 118 substantially by gravity only. There may be some small degree of interaction between the wafer and the support ring, but the wafer is primarily held in place by gravity, and in the case of a recessed support ring, by the edges of the recess. In some embodiments, the wafer is not chucked (e.g., electrostatically) to the support ring 118.

During passivation of the backside of the substrate, the front side can be idle or processed. In some embodiments, the front side of the substrate is exposed to an inert gas during backside passivation. In one or more embodiments, the front side is processed at the same time or immediately following the backside passivation.

In some embodiments, as shown in FIG. 1, the system 100 includes lift pins 140 to move the substrate closer to and further from the support ring 118. The lift pins 140 shown pass through the top surface 114 of the substrate support and curve in toward the cavity 120, so that when the lift pins 140 move up and down, the support ends 142 touching the substrate are inside the opening in the top surface 114. The lift pins 140 can be made of any suitable material including but not limited to, metals, plastics and polymeric materials. The lift pins 140 shown are merely illustrative and should not be taken as limiting the scope of the invention. Those skilled in the art will understand that other lift pin 140 designs can be used.

The backside passivation system can be located in various positions. For example, the backside passivation system can be (1) a separate processing chamber on a cluster tool; (2) an intermediate process area along one of the tunnels connecting a processing chamber to a central transfer station of a cluster tool; or (3) in the loadlock chamber connected to the transfer station of a cluster tool. These are merely illustrative of some positions that the system can be employed in and should not be taken as limiting the scope of the invention.

Figure 3:
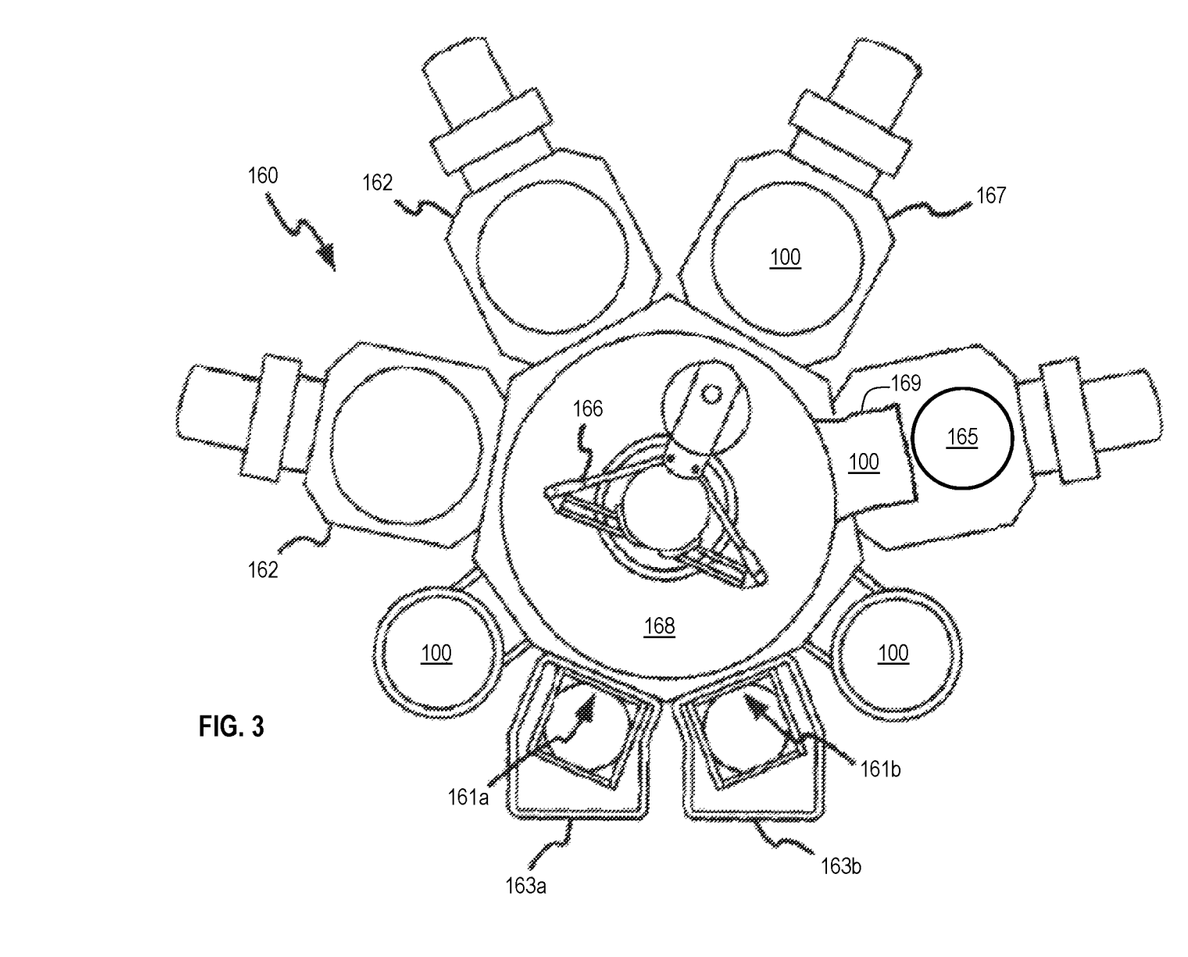
FIG. 3 shows a cluster tool incorporating the backside passivation system in accordance with one or more embodiments of the invention.

FIG. 3 shows a top schematic view of a cluster tool 160 having multiple single wafer processing chambers 162 mounted thereon. A cluster tool similar to that shown in FIG. 3 is available from Applied Materials, Inc. of Santa Clara, Calif. The tool includes load lock chambers 163a, 163b separated from transfer station 168 by slit valves 161a, 161b, respectively. The transfer station 168, also referred to as a central transfer station or a transfer chamber, includes a wafer handling robot 166 of the arm/knuckle/wrist type for moving the wafers from location to location within the system, in particular, between the multiple processing chambers 162. The tool shown has two single wafer processing chambers 162 and two backside passivation systems 100 positioned radially about the transfer station 168. The tool also has a combination single wafer processing chamber 167 with integrated backside passivation system 100 and a single wafer processing chamber 165 connected to the central transfer station 168 through a tunnel 169 with a backside passivation system 100. Those skilled in the art will understand that this is merely one example of a cluster tool and that there are many other possible arrangements.

In the cluster tool shown in FIG. 1, a substrate can be moved from the load lock chamber 163a through valve 161a and into the central transfer station 168 by robot 166. The robot 166 can then move the substrate into one of the backside passivation systems 100 where the backside of the wafer is passivated, as described herein. The robot 166 can then remove the wafer from the backside passivation system 100 and into the next chamber 162 for further processing. In some embodiments, the wafer is processed in one or more of the processing chambers 162 prior to backside passivation.

The cluster tool 160 is a relatively complex and expensive piece of equipment. It is therefore desirable to optimize throughput of wafer through the tool 160. Specifically, it is important to maximize the efficiency and wafer handling by the tool, such that processing chambers 162 are occupied as continuously as possible, and robot 166 within the transfer station 168 is continuously occupied and does not make unnecessary transit operations.

In some embodiments, the backside passivation system 100 is positioned within a semiconductor processing chamber 167 so that after positioning the substrate on the substrate support, the back side of the substrate can be passivated and the front side can be processed without moving the substrate. The backside and front side processing can be sequential or simultaneous. This configuration is shown in FIG. 3 as the combination of chamber 167 and backside passivation system 100.

In another embodiments, the backside passivation system 100 is positioned within a tunnel 169 connecting the central transfer station 168 with a processing chamber 165. In this embodiment, the robot 166 can transfer the wafer into the tunnel 169 and place it on the support, or on lift pins which lower the wafer onto the support. The backside of the wafer can be passivated and the lift pins can elevate the wafer so that the robot can move the wafer out of the tunnel and into the processing chamber 165 for further processing.

Figure 4:
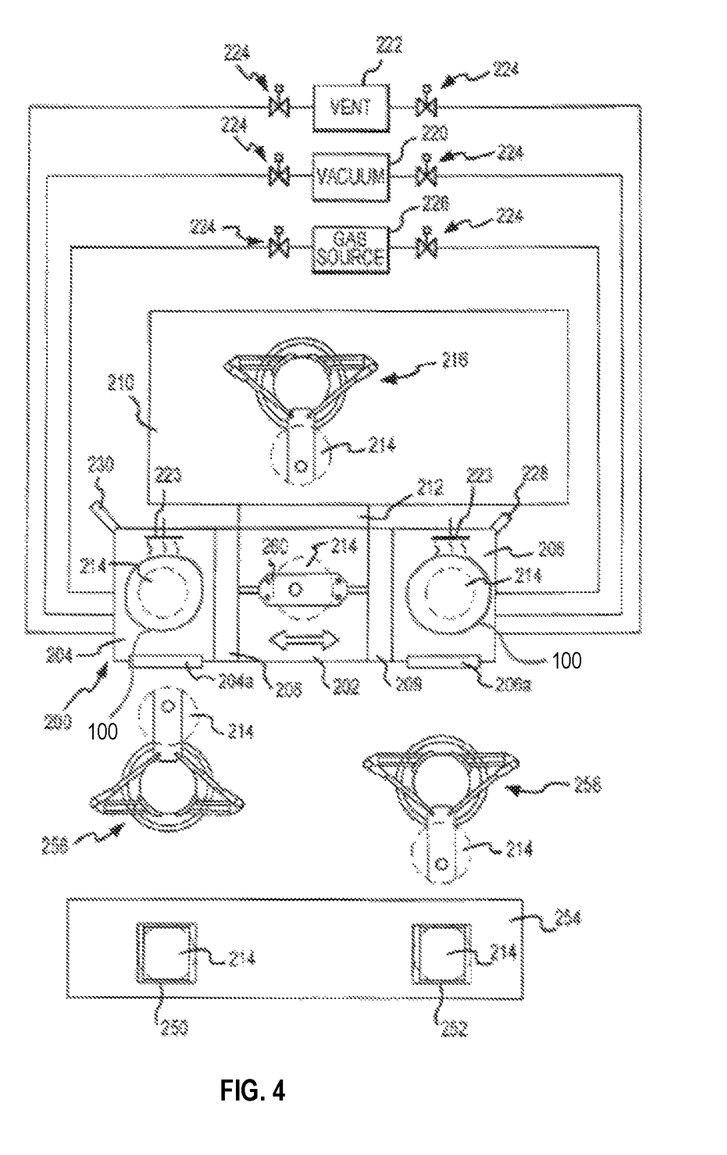
FIG. 4 shows a load lock incorporating the backside passivation system in accordance with one or more embodiments of the invention.

In some embodiments, the backside passivation system is positioned within a load-lock chamber so that a substrate passing through the load lock chamber can be positioned on the elongate substrate support and a back side of the substrate can be exposed to the plasma to form the passivation film. FIG. 4 is a plan view of one embodiment of a load lock structure in accordance with the present invention, which utilizes a lateral orientation of antechambers relative to the main load lock chamber.

FIG. 4 shows an exemplary load lock chamber 200 for use with embodiments of the invention. It will be understood by those skilled in the art that the load lock chamber shown is merely one possible embodiment and should not be taken as limiting the scope of the invention. Load lock 200 includes main load lock chamber 202 and first load lock antechamber 204. Second load lock antechamber 206 is positioned adjacent to main load lock chamber 202, on the side opposite of first load lock antechamber 204, coplanar with first antechamber 204 and main chamber 202. While FIG. 4 shows an embodiment featuring a single load lock, other embodiments may include more than one load lock.

Each of load lock antechambers 204 and 206 are in communication with an external wafer supply in the form of first and second cassettes 250 and 252, respectively. Cassettes 250 and 252 are positioned on local buffering table 254 so as to render wafers 214 housed therein accessible to loading robots 256 and 258 respectively, which are of the arm/knuckle/wrist variety. Buffering table 254 typically provides the interface between the cluster tool and other components of the fabrication facility.

Loading robots 256 and 258 transfer batches of wafers to and from load lock antechambers 204 and 206 via access ports 204a and 206a. While loading robots 256 and 258 shown in FIG. 4 are of the rotational arm/knuckle/wrist variety, other types of robots could be employed to perform this function.

Main chamber 202 of load lock 200 is selectively in communication with cluster tool mainframe 210 and cluster tool robot 216 through first slit valve 212. First load lock antechamber 204 is selectively in communication with main load lock chamber 202 through first slit valve 208. Second load lock antechamber 206 is in selective communication with main load lock chamber 202 through second slit valve 209.

The exchange of wafers between load lock antechambers 204 and 206 and load lock main chamber 202 may be performed by a variety of mechanical devices. As shown in FIG. 4, robot 260 present in load lock main chamber 202 is of the shuttle type that is capable of bi-directional motion along a single line. However, other examples of robots that can be used for transferring wafers between load lock chambers include arm/knuckle robots capable of rotating about a fixed point.

First load lock antechamber 204 and second load lock antechamber 206 are each in selective fluid communication with vacuum source 220, and vent 222 through valves 224. Antechambers 204 and 206 may thus be evacuated and vented independent from one another and from main load lock chamber 202. Additionally, any or both of the first load lock antechamber 204 and the second load lock antechamber 206 can also include a backside passivation system 100 which can passivate the backside of the wafer on the bottom of the cassette.

During operation of cluster tool 210, batches of wafers 214 are independently loaded by robots 256 and 258 into antechambers 204 and 206 through access ports 204a and 206a, respectively. Wafers 214 are then selectively moved through slit valves 208 or 209 to main load lock chamber 202, and then through slit valve 212 to cluster tool mainframe 210 for processing.

As wafers 214 are routed between the various processing stages of cluster tool 210, they may be housed in antechambers 204 and 206 to await an available tool processing chamber, or to await completion of processing of other wafers. For purposes of maintaining lot uniformity and ensuring error traceability, wafers generally remain associated with the same cassette throughout an entire semiconductor processing sequence. While in these antechambers, the wafer can be subjected to backside passivation by a backside passivation system 100.

When all wafers of a particular batch have been processed by the tool and are returned to their respective antechamber 204 or 206, that antechamber may be sealed off from main load lock chamber 202 and vented, while wafers can continue to be processed using the other antechamber. This permits wafers present in the vented antechamber to be off-loaded and replaced with a fresh batch to enable continuous processing by the tool. The previously vented antechamber may then be pumped down and reunited with the still-evacuated main load lock chamber 202.

Additional embodiments of the invention are directed to methods of processing. A substrate having front side to be processed and a back side is placed in a chamber. The backside of the substrate is passivated in the chamber and the front side of the substrate is processed, wherein processing the substrate comprises heating the substrate. In some embodiments, processing the substrate involves heating the substrate to a temperature at which the backside of the substrate, or features on the backside of the substrate would be subjected to sublimation or outgassing.

In some embodiments, passivating the back side of the substrate comprises depositing a passivating film on the back side of the substrate by exposing the back side of the substrate to one or more of a reactive gas and/or a plasma.

In one or more embodiments, the film comprising one or more of a nitride and an oxide layer. In some embodiments, the passivating film has a thickness greater than about 5 Å, or greater than about 10 Å, or greater than about 15 Å, or greater than about 20 Å or greater than about 25 Å.

In one or more embodiments, the passivating film is removed from the backside of the substrate after the front side has been processed. The film can be etched or removed by any suitable technique that will not damage the underlying features or the front side of the substrate. The specific technique used to remove the passivating film will depend on the composition and thickness of the film.

During backside passivation, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during backside passivation. A rotating substrate can be rotated continuously or in discreet steps. For example, a substrate may be rotated throughout the entire process, or the substrate can be rotated by a small amount between exposure to different reactive or purge gases. Rotating the substrate during processing (either continuously or in steps) may help produce a more uniform deposition or etch by minimizing the effect of, for example, local variability in gas flow geometries.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

What is claimed is:

1. A processing method comprising:
placing a substrate in a chamber on an elongate substrate support, the substrate having a front side to be processed and a back side, the elongate substrate support having a cylindrical body with an open tope surface with a support ring to hold the substrate by an edge region, the cylindrical body defining a cavity within the elongate substrate support;
passivating the back side of the substrate in the chamber;
processing the front side of the substrate, wherein processing comprises heating the substrate; and
moving the substrate closer to and further from the substrate support using a plurality of lift pins, the lift pins passing downward through openings in the top surface of the substrate support and curing in toward a center of the cavity to form support ends inside the cavity below the top surface of the substrate support.

2. The method of claim 1, wherein passivating the back side of the substrate comprises depositing a passivating film on the back side of the substrate by exposing the back side of the substrate to one or more of a reactive gas or a plasma.

3. The method of claim 2, wherein the film comprising one or more of a nitride or an oxide layer.

4. The method of claim 3, wherein the film has a thickness greater than about 15 Å.

5. The method of claim 2, wherein the chamber is a load-lock chamber and the substrate is moved to a second chamber after passivating the back side and before processing the front side.

6. The method of claim 2, wherein passivating the back side of the substrate and processing the front side of the substrate occurs in a single chamber.

7. The method of claim 2, wherein the chamber is an intermediate region between a load lock chamber and a processing chamber that processes the front side of the substrate.

8. The method of claim 2, further comprising removing the passivating film from the back side of the substrate.

9. The method of claim 2, wherein the plasma generator is located remotely from the cavity and the plasma is flowed into the cavity.

10. The method of claim 1, wherein passivating the substrate comprises exposing the substrate to a plasma source spaced a distance in the range of about 0.25 inches to about 2.5 inches from the substrate, the distance being large enough to prevent direct coupling between the substrate and the plasma source.

11. The method of claim 10, wherein the plasma source creates an inductively coupled RF plasma in the cavity.

12. The method of claim 1, wherein the substrate is held on the support ring substantially only by gravity.

13. A processing method comprising:
placing a substrate in a chamber on an elongate substrate support, the substrate having a front side to be processed and a back side, the elongate substrate support having a cylindrical body with an open tope surface with a support ring to hold the substrate by an edge region, the cylindrical body defining a cavity within the elongate substrate support, the substrate moved closer to the substrate support using a plurality of lift pins, the lift pins passing downward through openings in the top surface of the substrate support and curving in toward a center of the cavity to form support ends inside the cavity below the top surface of the substrate support;
passivating the back side of the substrate in the chamber by exposing the back side of the substrate to plasma to form a film comprising one or more of a nitride or an oxide layer; and
processing the front side of the substrate, wherein processing comprises heating the substrate.

14. The method of claim 13, wherein the film has a thickness greater than about 15 Å.

15. The method of claim 13, wherein the chamber is a load-lock chamber and the substrate is moved to a second chamber after passivating the back side and before processing the front side.

16. The method of claim 13, wherein passivating the back side of the substrate and processing the front side of the substrate occurs in a single chamber.

17. The method of claim 13, wherein the chamber is an intermediate region between a load lock chamber and a processing chamber that processes the front side of the substrate.

18. The method of claim 13, further comprising removing the passivating film from the back side of the substrate.

19. The method of claim 13, wherein the plasma is generated by a plasma source spaced a distance in the range of about 0.25 inches to about 2.5 inches from the substrate, the distance being large enough to prevent direct coupling between the substrate and the plasma source.

* * * * *

UNITED STATES PATENT AND TRADEMARK OFFICE
CERTIFICATE OF CORRECTION

PATENT NO. : 10,535,513 B2  
APPLICATION NO. : 16/008500  
DATED : January 14, 2020  
INVENTOR(S) : Lara Hawrylchak et al.

Page 1 of 1

It is certified that error appears in the above-identified patent and that said Letters Patent is hereby corrected as shown below:

In the Claims

In Column 9, Claim 1, Line 14, replace "tope" with "top".

In Column 10, Claim 13, Line 15, replace "tope" with "top".

Signed and Sealed this  
Thirteenth Day of October, 2020

Andrei Iancu  
*Director of the United States Patent and Trademark Office*